(12) United States Patent
Tailliet

(10) Patent No.: US 8,310,879 B2
(45) Date of Patent: Nov. 13, 2012

(54) METHOD OF PROGRAMMING AN ELECTRICALLY PROGRAMMABLE AND ERASABLE NON-VOLATILE MEMORY POINT, AND CORRESPONDING MEMORY DEVICE

(75) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 144 days.

(21) Appl. No.: 12/965,152

(22) Filed: Dec. 10, 2010

(65) Prior Publication Data
US 2011/0141805 A1    Jun. 16, 2011

(30) Foreign Application Priority Data
Dec. 11, 2009   (FR) ..................................... 09 58868

(51) Int. Cl.
*G11C 16/04* (2006.01)
(52) U.S. Cl. ........... 365/185.29; 365/185.18; 365/185.2; 365/185.22
(58) Field of Classification Search ............. 365/185.29, 365/185.18, 185.22, 185.2, 185.24
See application file for complete search history.

(56) References Cited

U.S. PATENT DOCUMENTS

| 5,787,037 A | 7/1998 | Amanai ......................... 365/185 |
| 7,522,457 B2 * | 4/2009 | Hemink et al. .......... 365/185.29 |
| 2004/0057265 A1 | 3/2004 | Mirabel et al. .................. 365/45 |
| 2005/0122783 A1 | 6/2005 | Kim et al. ..................... 365/185 |

FOREIGN PATENT DOCUMENTS

FR    2842344    1/2004

* cited by examiner

*Primary Examiner* — David Lam
(74) *Attorney, Agent, or Firm* — Allen, Dyer, Doppelt, Milbrath & Gilchrist, P.A.

(57) ABSTRACT

An electrically programmable and erasable non-volatile memory point may have at least one floating-gate transistor connected to a bit line and to a ground line, and may be programmed with a programming voltage. In an erase phase of the memory point, a first, negative, voltage may be applied to the bit line and to the ground line. The absolute value of the first voltage may be smaller than a threshold value of a PN diode. A second positive voltage which is smaller than the programming voltage may be applied to the control gate of the floating-gate transistor. The difference between the second voltage and the first voltage may be equal to the programming voltage, and, in a writing phase, the first negative voltage may be applied to the control gate of the floating-gate transistor, and the second voltage may be applied to the bit line.

32 Claims, 12 Drawing Sheets erasure
E/W = 1
V-CG = 0
CGV = V2 writing
E/W = 0
V-CG = V-
CGV = V- erasure
E/W = 1
V-CG = V−
BLV = V− writing
E/W = 0
V-BL = 0
BLV = V2

METHOD OF PROGRAMMING AN ELECTRICALLY PROGRAMMABLE AND ERASABLE NON-VOLATILE MEMORY POINT, AND CORRESPONDING MEMORY DEVICE

FIELD OF THE INVENTION

The invention relates to memories, more specifically electrically erasable and programmable non-volatile memories (EEPROMs).

BACKGROUND OF THE INVENTION

In an EEPROM, the logical value of a bit stored in a memory point may be represented by a threshold voltage of a floating-gate transistor, which may be modified by writing or erase operations. Writing or erasing may be carried out on a floating-gate transistor by injecting electrical charges into the transistor gate, or removing them from it, by a tunnel effect (the Fowler-Nordheim effect), using a high programming voltage Vpp which may be about 10 to 20 volts, and is typically 16 volts.

This high voltage of 16 volts, which is generally required for programming EEPROMs, may not be reduced and may set considerable constraints on the processing and reliability of the product. This is because the lithographic reduction, i.e. the increase of the etching resolution, tends to decrease the operating voltages. This high programming voltage may become more problematic, particularly in relation to the punch-through and leakage of the source/drain junctions of the transistors and the breakdown of the gate oxides. These risks of breakdown and premature aging of the transistors may have a direct impact on the reliability of the product.

SUMMARY OF THE INVENTION

One approach, known as the "split voltage" approach, has been devised. More specifically, the high voltage Vpp for programming the memory planes may be split between a positive voltage Vpp+ and a negative voltage Vpp− such that the difference (Vpp+−Vpp−) may be equal to Vpp. With this method, a voltage Vpp+ of about 12 volts, and a voltage Vpp− of about −4 volts may be chosen.

This approach reduces the constraint on the voltage capacity of the transistors. However, it may have the drawback of making the memory plane production process more complicated, as a "triple case" technology is used because of the negative voltage of several volts. Furthermore, the control design may be relatively more complicated because negative switching voltages are provided, which also may have a negative effect on the area of the memory plane. This may be because negative voltage switching may be relatively costly in terms of memory plane area (use of p-type metal oxide semiconductor (PMOS) transistors) where the control gate selection transistors are concerned, and may be inappropriate for the low granularity of EEPROMs.

In one form of application and embodiment, a method for programming an electrically programmable and erasable non-volatile memory point, with a corresponding memory device, which is compatible with a conventional approach for producing memories of this type is described. In other words, it may involve relatively little, for example, modification of the production process, and may be compatible with byte granularity. The method may reduce the production constraints on the voltage capacity of the transistors and considerably increase the reliability by reducing the risk of oxide breakdown.

According to one aspect, a method for programming an electrically programmable and erasable non-volatile memory point which has at least one floating-gate transistor connected to a bit line and to a ground line, and which can be programmed with a programming voltage is described. According to a general characteristic of this aspect, during an erase phase of the memory point, a first, negative, voltage may be applied to the bit line and the ground line. The absolute value of this first voltage may be smaller than the threshold value of a PN diode, while a second, positive, voltage may be applied to the control gate of the floating-gate transistor. The latter voltage may be smaller than the programming voltage. The difference between the second voltage and the first voltage may be equal to the programming voltage, and in a phase of writing to the memory point, the first, negative, voltage may be applied to the control gate of the floating-gate transistor, and the second voltage may be applied to the bit line.

This is because a relatively small variation in the programming voltage may be sufficient to have a considerable (exponential) effect on the reliability of the memory points with respect to gate oxide breakdown. Additionally, by using a negative voltage below the threshold value of a PN diode, for example a negative voltage of about 500 millivolts, it may be possible to achieve this considerable effect on the reliability of the memory points while retaining the compatibility with a conventional EEPROM memory point production process, using a "single well" technology, for example. This low negative voltage may be compatible with such a technology, because it may avoid the avalanching of the PN junctions.

Additionally, the memory point may short-circuit the bit line and the ground line in the erase phase. The simultaneous application of the negative voltage to the bit line and the ground line (instead of the conventional application of the ground voltage (in other words, 0 volts on the ground line)) may reduce the chances of a short circuit between the negative voltage and 0 volts.

In one embodiment, in which the floating-gate transistor is an N-conducting MOS transistor made by the "single well" technology, a first negative voltage of about −0.5 volt may be applied while a second positive voltage of about 15.5 volts may be applied. With these values, the resulting programming voltage may be 16 volts. The negative voltage and the positive voltage mentioned above are defined with respect to the substrate potential of the transistor or the transistors.

Thus, in an example of this kind, −0.5 volt may be sent to the bit line and the ground line during the erase phase, while −0.5 volt may be sent to the control gate of the floating-gate transistor during the writing phase.

According to another aspect, a memory device may comprise a memory plane having at least one electrically programmable and erasable non-volatile memory point having at least one floating-gate transistor connected to a bit line and to a ground line, and a means of programming, or a programming module for programming the memory point with a programming voltage.

According to a general characteristic of this aspect, the programming means or module may comprise a first means or component or module configured to generate a first negative voltage whose absolute value may be lower than the threshold value of a PN diode. The programming means or module may also include a second means or component or module configured to generate a second positive voltage, which may be lower than the programming voltage. The difference between the second voltage and the first voltage may be equal to the programming voltage.

The programming means or module may also include a control means or module configured to apply the first negative voltage to the bit line and to the ground line, and to apply the second positive voltage to the control gate of the floating-gate transistor when erasing the memory point. The control module may apply the first negative voltage to the control gate and the second voltage to the bit line when writing to the memory point. The first means, or component or module may include a negative charge pump circuit.

In one embodiment, the negative charge pump circuit may have an input for receiving a control voltage, an output for delivering the first negative voltage, a first capacitor connected to the input, and a first diode connected between the first capacitor and ground. A second capacitor may be connected between the output and ground. A charge transfer diode may be connected between the two capacitors, and a second diode may be connected between the transfer diode and ground.

In one embodiment, the control means or module may include a switch having an input connected to the output of the first means or component or module, a first output, a second output, a third output, and a control circuit configured to receive a programming logic signal representing a program and a write/erase logic signal having a first logic value representing an erase operation and a second logic value representing a writing operation. The control circuit is also configured to connect the first output to the input, and the third output to ground when the first logic value of the programming logic signal and the second logic value of the write/erase signal are present. The control circuit is also configured to connect the first output to a ground, and the third output to the input when the first logic value of the programming logic signal and the first logic value of the write/erase signal are present.

The control module may also include an on/off switch connected between the second output of the switch and the ground line. The on/off switch may be controllable by the write/erase signal such that it may conduct when the write/erase signal has its first logic value, in other words, the value for erase. The control module may also include a first level translator controllable by the write/erase logic signal, and may have an input connected to the first output of the switch and an output connected to the control gate. A second level translator may be controllable by the complement of the write/erase logic signal, and may have an input connected to the third output of the switch and an output connected to the bit line.

Thus, when the memory plane is erased, the output voltage of the charge pump may be sent to the ground lines in the memory plane and may replace the conventional potential of 0 volts. Similarly, the output voltage of the charge pump may be sent to the input of the level translator for the control gate of the floating-gate transistor during writing, and may replace the conventional 0 volt potential.

In one embodiment, the memory plane may be a matrix memory plane having a plurality of memory points, and the programming means or programming module may include a block of first latch memories connected between the output of the first level translator and the control gates of the memory points, and a block of second latch memories connected between the output of the second level translator and the bit lines connected to the memory points. The memory plane may be a memory plane of the EEPROM or flash-type memories and may include single-well NMOS transistors.

BRIEF DESCRIPTION OF THE DRAWINGS

Other advantages and features of the invention will be made clear by the detailed description of embodiments, which is not limiting in any way, and the appended drawings, of which.

DETAILED DESCRIPTION OF THE PREFERRED EMBODIMENTS

Figure 1:
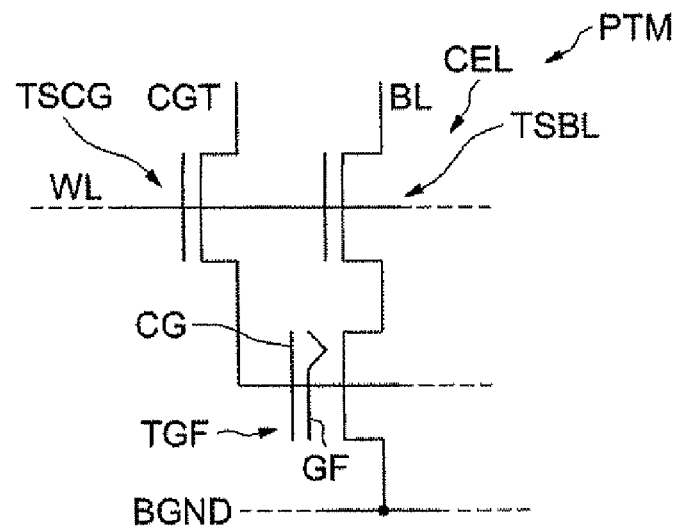
FIG. 1 is a schematic diagram of an exemplary embodiment of an EEPROM memory point in accordance with the present invention.

An example of the architecture of memory points is illustrated in FIG. 1. In this drawing, the memory point PTM has a memory cell CEL including a transistor TGF having a control gate CG and a floating gate GF. The cell CEL is connected to a bit line BL through a bit line selection transistor TSBL.

The cell also includes a control gate selection transistor TSCG connected between a gate control line CGT and the control gate CG of the floating-gate transistor TGF. The gates of the transistors TSCG and TSBL are connected to a word line WL extending in a conventional way perpendicularly to the bit line BL. The source of the transistor TGF is connected to a ground line BGND.

The architecture of FIG. 1 therefore provides one cell memory for each bit. This memory point can be programmed, that is, written to or erased, or read.

Generally, words of x bits, typically eight bits, forming bytes, are stored in an EEPROM. Typically, therefore, the storage area for a byte has eight memory points and a gate control selection transistor TSCG (because the control gates of the eight memory cells of the eight memory points are generally all connected together and selected from the CGT line), together with a ground line BGND. In some cases, this ground line BGND can be connected to a negative voltage, as will be detailed below.

Figure 2:
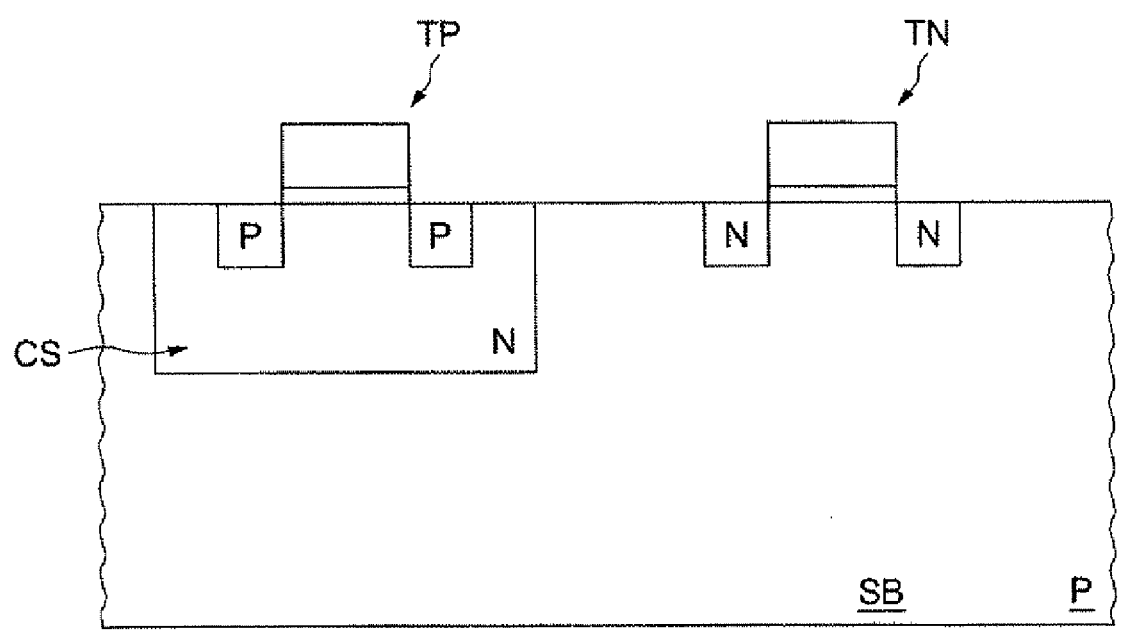
FIG. 2 is a schematic diagram of a memory point formed using "single well" technology.

The programming of a byte includes a global erase cycle for the word, followed by a selective writing cycle. The memory point PTM is formed with NMOS transistors, which in this case, are made conventionally by "single well" technology, an example of which is illustrated schematically in FIG. 2.

More specifically, if a P-type substrate SB is used, the NMOS transistors TN may be formed in the substrate SB, whereas the PMOS transistors TP may be formed in an N-type well CS. If an N-type substrate SB were used, there would be a single P-type well in which the NMOS transistors would be formed, while the PMOS transistors would be formed in the substrate. This single-well architecture is distinguished, for example, from triple-well architectures in which the NMOS transistors are formed in a well P, which is itself insulated by an N-type well formed in a P-type substrate.

Figure 3:
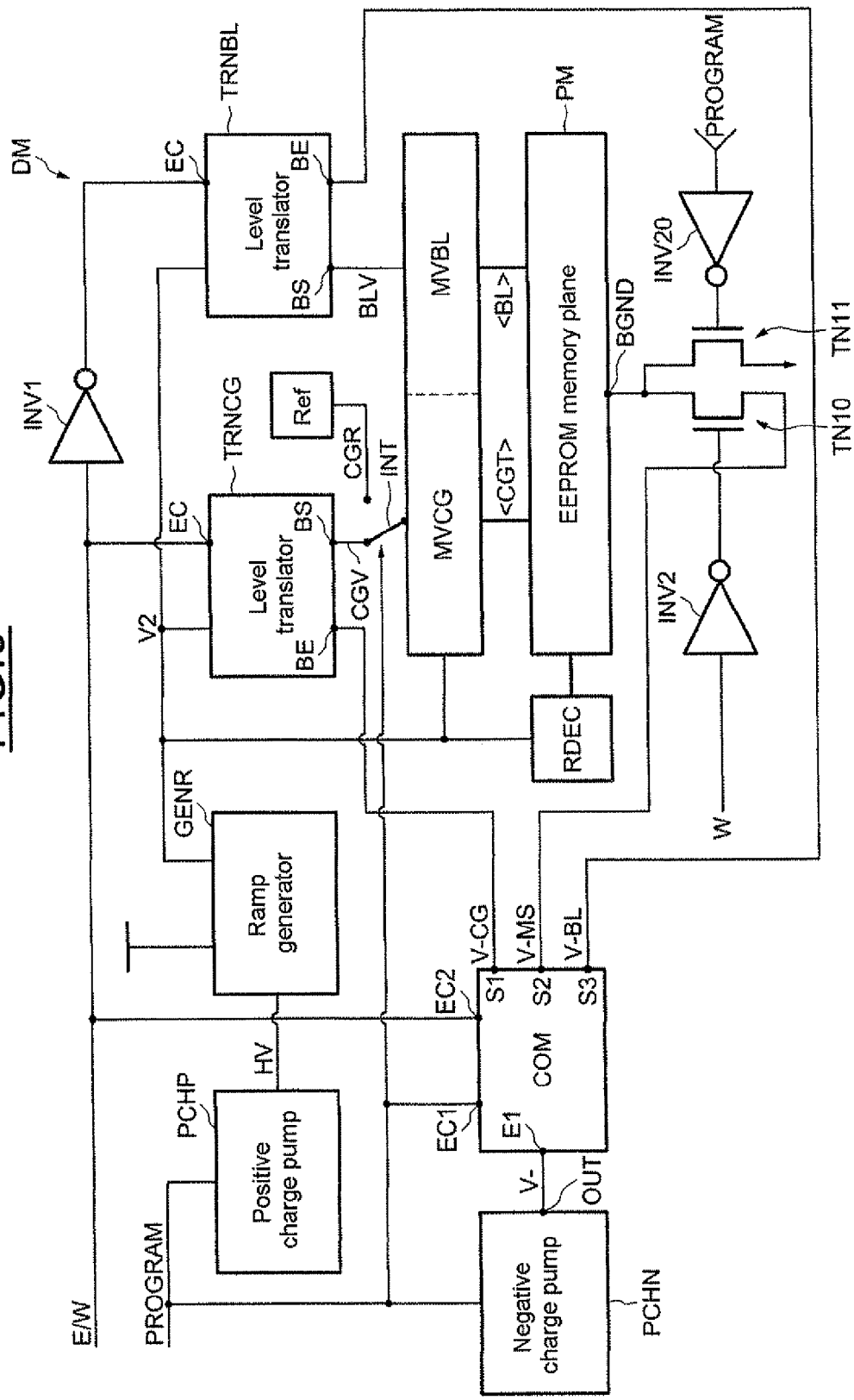
FIG. 3 is a schematic diagram of an embodiment of a memory device according to the invention.

FIG. 3 shows a schematic diagram of an example of an architecture of a memory device DM according to an embodiment. In this case, the memory device DM has a memory plane PM of the EEPROM type. This memory plane is a conventional matrix memory plane, which, in this example, has rows and columns of memory points PTM of the type shown in FIG. 1. The known conventional elements of such a memory device may include, notably, a row decoder RDEC together with memories, as may be known to those skilled in the art as "latch memories," connected to the control lines CGT and to the bit lines BL. The latch memories associated with the control gate selection transistors are denoted by MVCG, while the latch memories associated with the bit lines are denoted by MVBL.

These latch memories receive the voltages CGV and BLV delivered by the respective output terminals BS of level translators TRNCG and TRNBL associated respectively with the control gates of the floating-gate transistor and with the bit lines. Conventional column decoding means or column decoder, omitted from the drawing in the interests of simplicity, are also provided, and are connected to the memory plane PM.

In addition to these elements, the memory device DM includes a positive charge pump circuit PCHP, which may have a known conventional structure and which delivers a relatively high voltage HV to a ramp generator GENR, which may also have a known conventional structure.

This ramp generator delivers a relatively high positive voltage V2, typically about 15.5 volts. This voltage V2 is delivered, to the level translators TRNCG, TRNBL, to the row decoder RDEC, and to the latch memories MVCG and MVBL.

In addition to these elements, the memory device has a negative charge pump circuit PCHN which, when activated in the programming mode by a control signal PROGRAM, delivers a relatively low negative voltage V−, about −500 millivolts, for example. The output OUT of the negative charge pump circuit PCHN is connected to an input E1 of a switch COM, which has three outputs S1, S2 and S3, delivering the voltages V-CG, V-MS and V-BL respectively.

The switch COM also has two control inputs EC1 and EC2, which receive, respectively, the logic signal PROGRAM and a write/erase logic signal denoted by E/W. This logic signal E/W is also delivered to the control input EC of the level translator TRNCG and to the control input EC of the level translator TRNBL, after being inverted by an inverter INV1.

The first output S1 of the switch is connected to the input terminal BE of the level translator TRNCG, while the third output S3 of the switch is connected to the input terminal BE of the level translator TRNBL. The second output S2 of the switch is connected to the internal ground line BGND of the memory points PTM of the memory plane PM through a transistor TN10 whose gate is controlled by a logic signal W inverted in an inverter INV2. The logic signal W is at "1" in a "write" mode and at "0" in an "erase" mode. The signal PROGRAM also controls, through an inverter INV20, a transistor TN11 connected between the internal ground line BGND and the ground.

Finally, a switch INT, controlled by the PROGRAM signal, may connect the latch memories MVCG either to the output BS of the level translator TRNCG in the programming mode, or to the output of a reference voltage source Ref, which delivers a voltage of 1 volt, for example, in a read mode.

Figure 4:
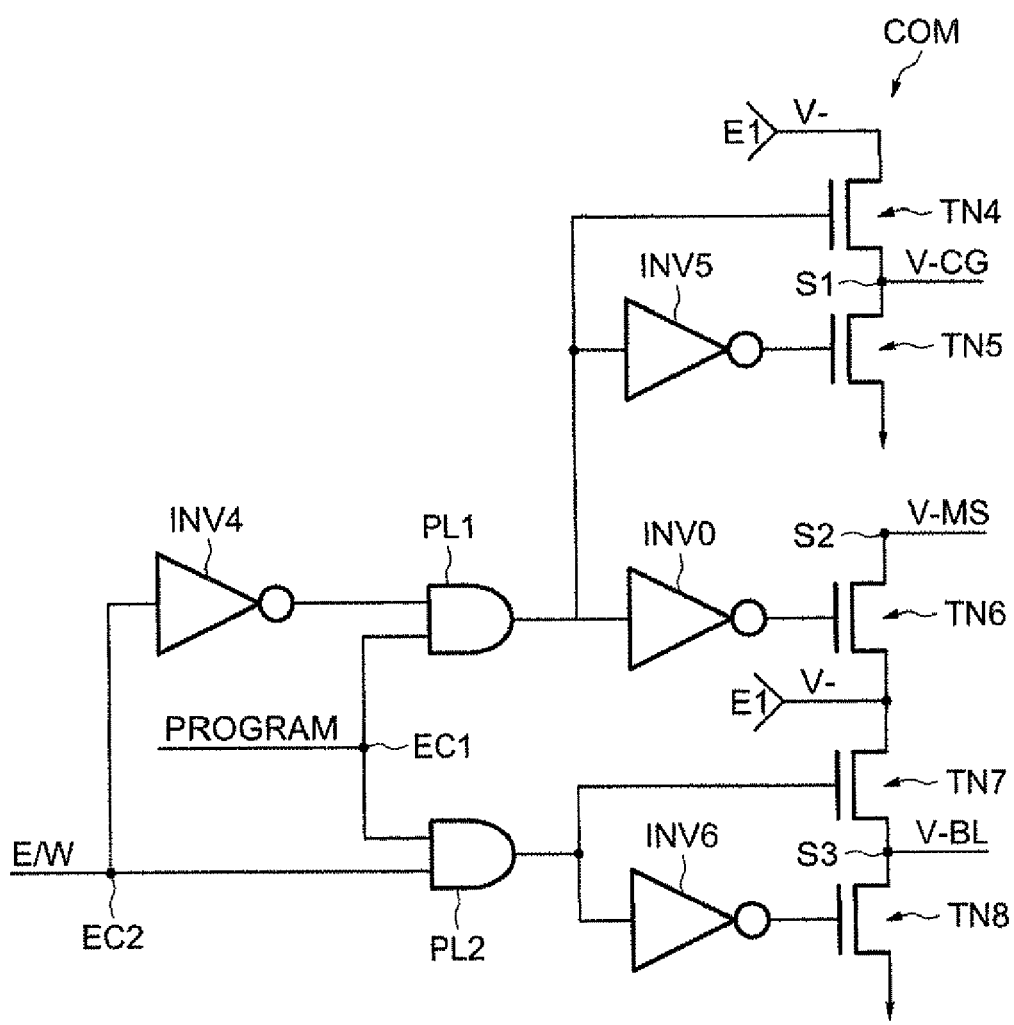
FIG. 4 is a schematic diagram of a switch unit of the memory device of FIG. 3.

FIG. 4 shows a non-limiting embodiment of a switch unit COM. More specifically, the source of an NMOS transistor TN4 forms the input E1 of the switch COM, and the drain of this transistor TN4 forms the first input S1. The drain of the transistor TN4 is connected to the drain of another NMOS transistor TN5 whose source is connected to ground.

The gate of the transistor TN4 is connected to the output of a logic gate ET denoted by PL1, and the gate of the transistor TN5 is also connected to the output of the logic gate PL1 through an inverter INV5. The drain of another NMOS transistor TN6 forms the second output S2 of the switch COM, while its source is connected to the input E1.

The source of the transistor TN6 is connected to the source of an NMOS transistor TN7 whose drain forms the third output S3. The drain of the transistor TN7 is connected to the drain of an NMOS transistor TN8 whose source is connected to ground.

The gate of the transistor TN6 is connected to the output of the logic gate PL1 through an inverter INV0, while the gate of the transistor TN7 is connected to the output of another logic gate ET, denoted by PL2. The gate of the transistor TN8 is also connected to the output of the logic gate PL2 through an inverter INV6.

The first two inputs of the logic gates PL1 and PL2 are connected to each other and form the first control input EC1 of the switch COM receiving the logic signal PROGRAM. The other input of the logic gate PL2 forms the second control input EC2 of the switch COM, which receives the logic signal E/W. The other input of the logic gate PL1 is also connected to the control input EC2 through an inverter INV4.

Figure 5:
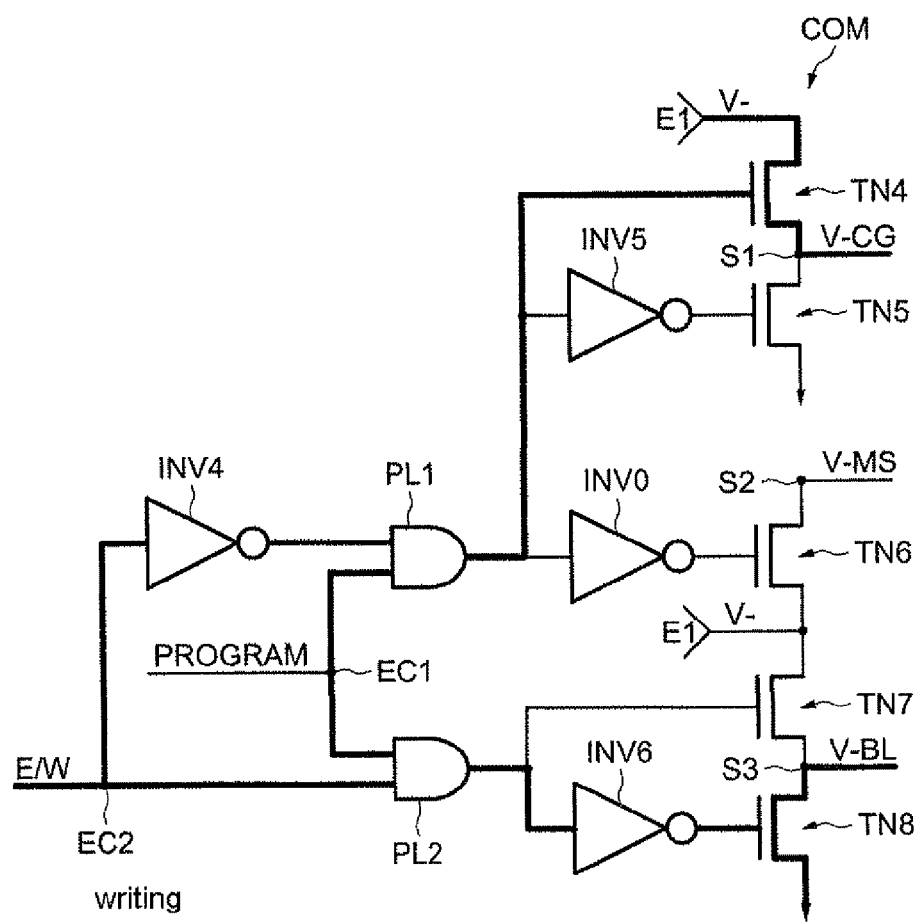
FIG. 5 is a schematic diagram of the switch unit of FIG. 4 in a writing phase.

In a writing phase, shown in FIG. 5, the logic signal E/W is equal to 0, for example, and the logic signal PROGRAM is equal to 1. The output of the logic gate PL1 is therefore equal to 1, which makes the transistor TN4 conduct and thus supplies, at the first output S1, a voltage V-CG equal to the voltage V-delivered by the negative charge pump circuit. The transistor TN6 is turned off, leaving the voltage V-MS floating. Conversely, the output of the logic gate PL2 is equal to 0, which turns off the transistor TN7 and makes the transistor TN8 conduct, thus producing at the output S3 a voltage V-BL of zero (the output S3 is connected to ground).

Figure 6:
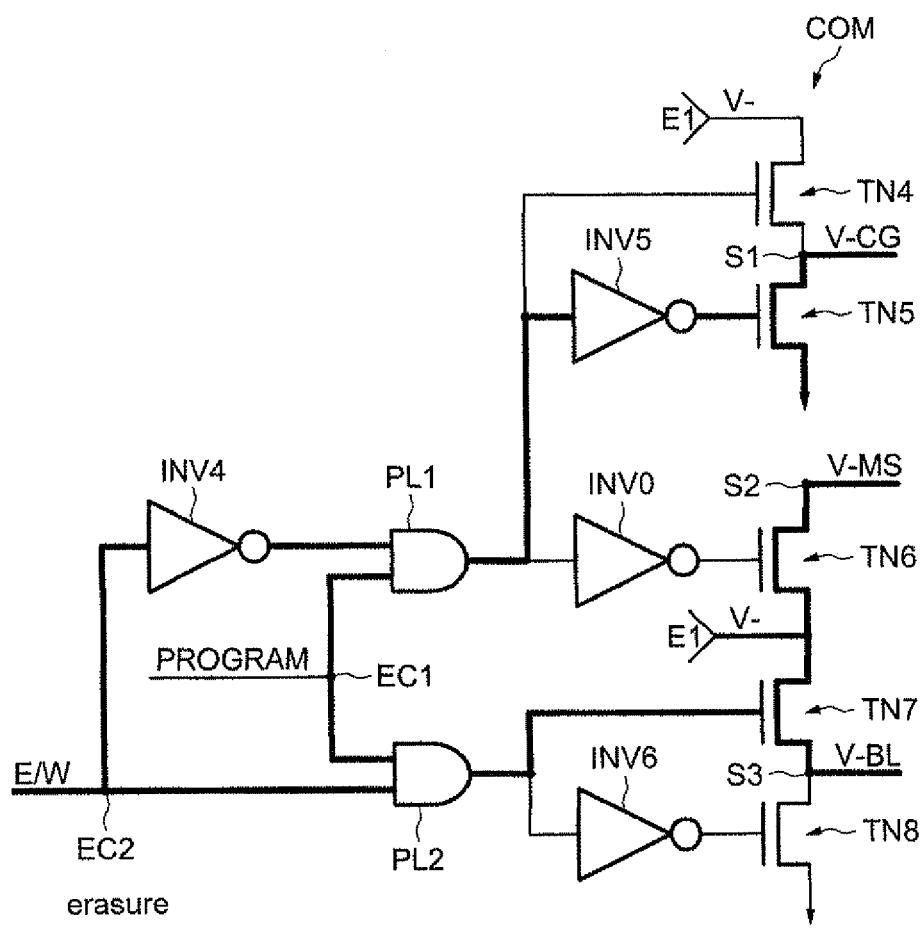
FIG. 6 is a schematic diagram of the switch unit of FIG. 4 in an erasure phase.

On the other hand, in an erase phase (writing a zero), shown in FIG. 6, the logic signal E/W is equal to 1, and the logic signal PROGRAM also remains equal to 1. This time, the transistor TN4 is off, and it is the transistor TN5 that conducts, thus connecting the output S1 to ground and supplying a zero voltage V-CG.

The transistor TN6 is conducting, so that a voltage V-MS equal to V−can be delivered to the output S2. Since the logic signal W (FIG. 3) is equal to 0 in the erase phase, the transistor TN10 is conducting, and the internal ground lines BGND of the memory plane receive the voltage V−.

The transistor TN7 is conducting, enabling the voltage V− delivered by the negative charge pump circuit to be sent to the output S3. The transistor TN8 is turned off in this configuration.

Figure 7:
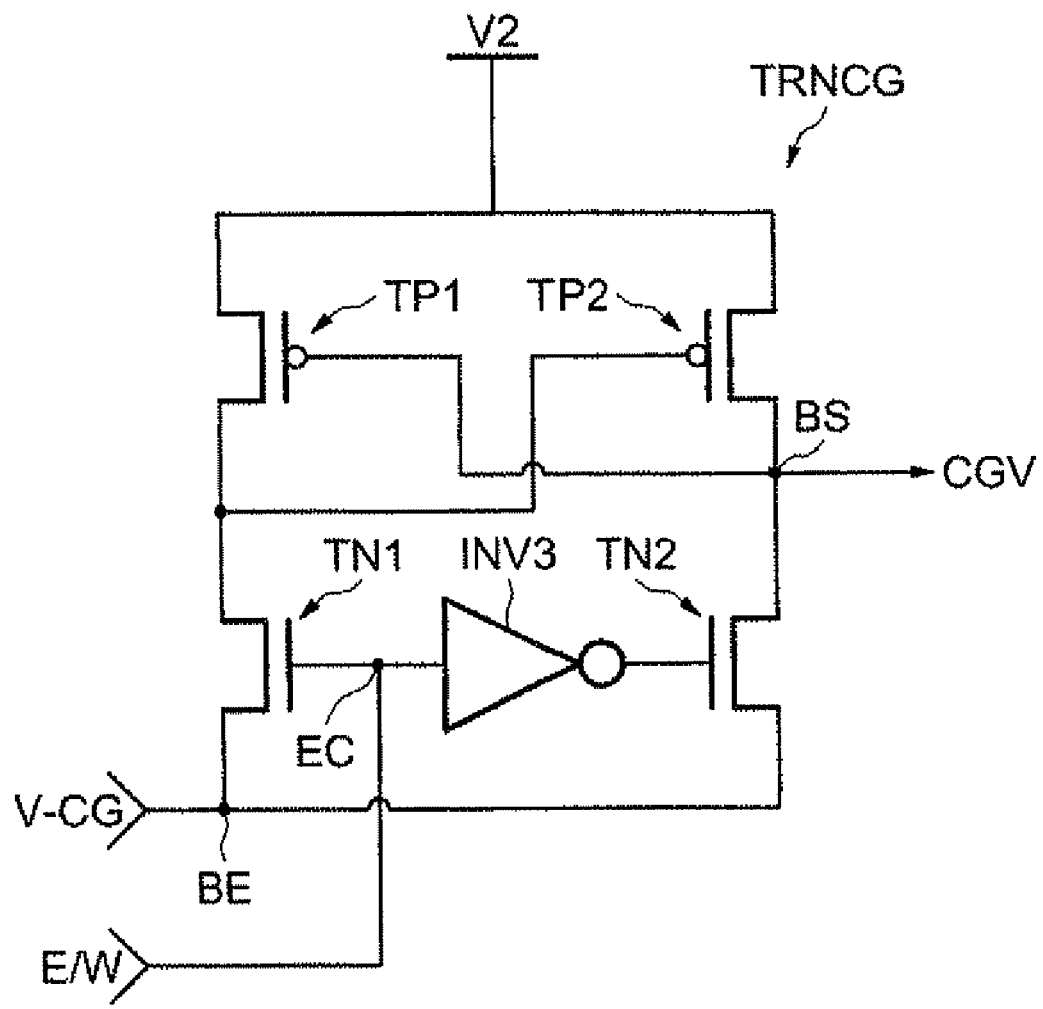
FIG. 7 is a schematic diagram of a level translator of the memory device of FIG. 3.

FIG. 7 shows an embodiment of a level translator TRNCG. This structure may be conventional and non-limiting. The level translator TRNCG has two cross-connected PMOS transistors TP1 and TP2. More specifically, the sources of the two PMOS transistors TP1 and TP2 are connected to the positive power source V2, while the gate of one of these transistors is connected to the drain of the other transistor and vice versa. The drain of the transistor TP2 forms the output terminal BS of the level translator TRNCG.

An NMOS transistor TN1 is connected between the PMOS transistor TP1 and the input terminal of the level translator. Similarly, a transistor TN2 is connected between the output terminal BS and the input terminal BE. The gates of the two transistors TN1 and TN2 are interconnected via the inverter INV3. The input of the inverter INV3 forms the control input EC of the level translator and is configured to receive the logic signal E/W.

Figure 8:
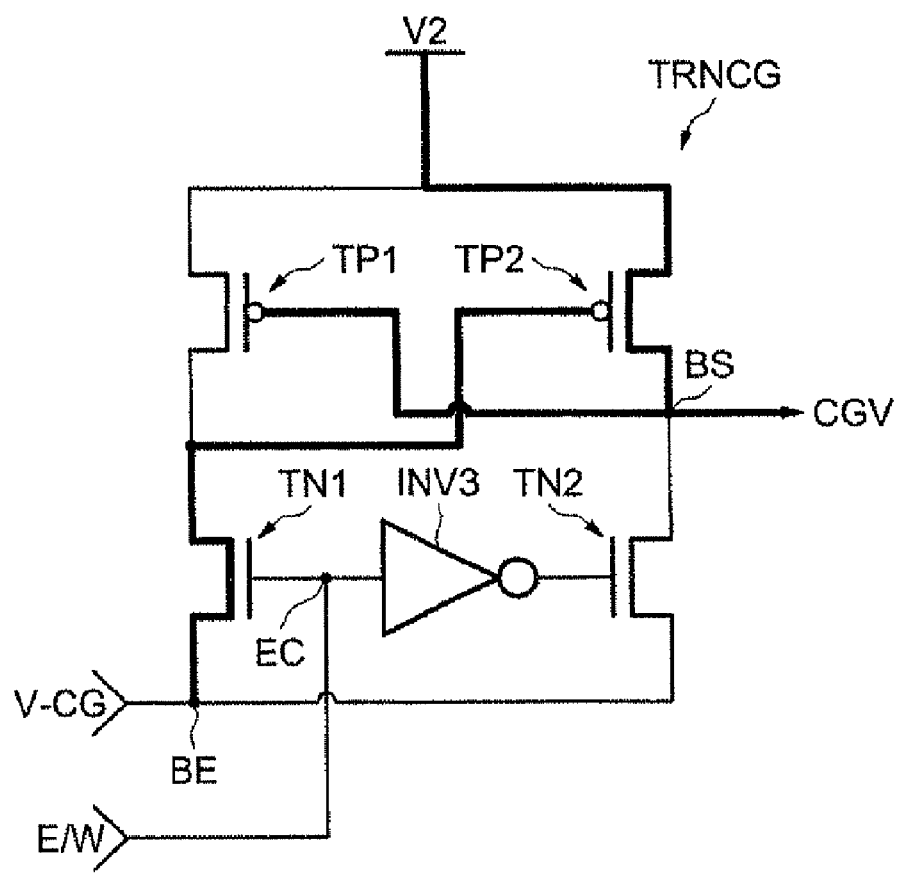
FIG. 8 is a schematic diagram of the level translator of FIG. 7 in an erasure phase.

In the erase mode or phase, that is to say when the logic signal E/W is equal to 1 (FIG. 8), the transistor TN1 is conducting. Since the voltage V-CG is zero, the transistor TP2 is conducting, enabling a voltage CGV equal to the voltage V2 to be delivered to the output terminal BS. The transistors TN1 and TN2 are also turned off.

Figure 9:
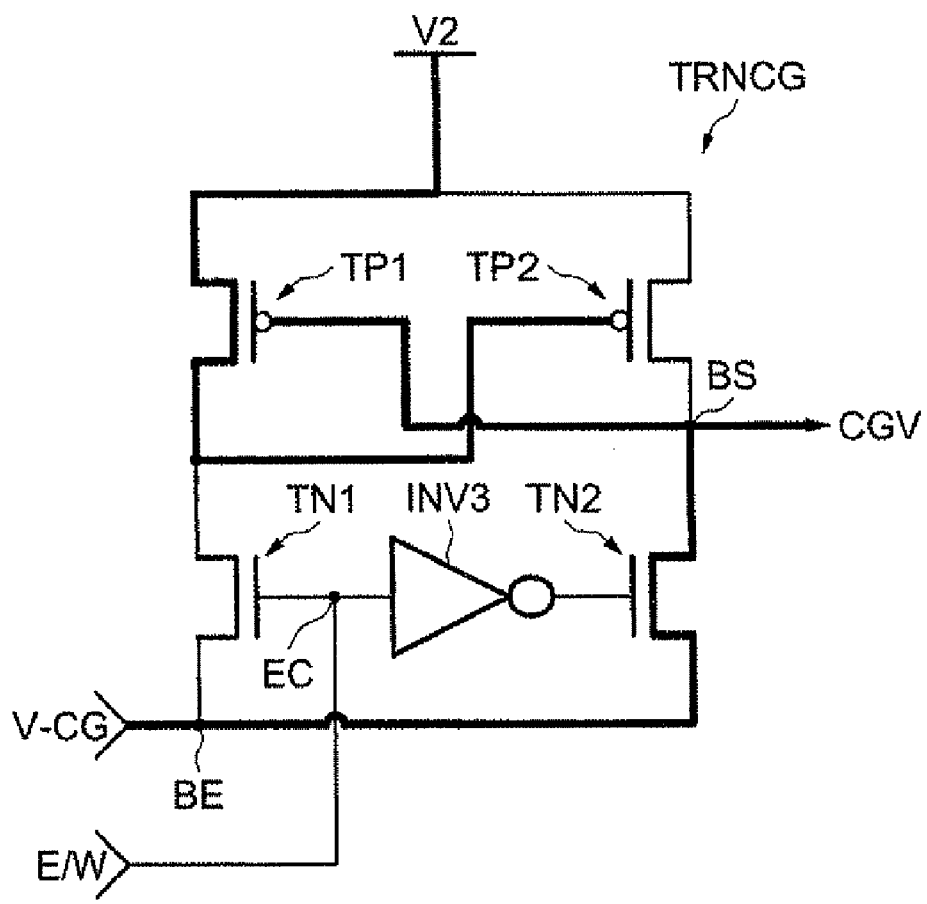
FIG. 9 is a schematic diagram of the level translator of FIG. 7 in a writing phase.

In the writing phase (FIG. 9), the signal E/W is zero and the voltage V-CG available at the input terminal BE of the level translator is equal to the voltage V−. The transistor TN2 is conducting, as is the transistor TP1. Consequently the transistor TP2 is turned off, and a voltage CGV equal to the voltage V− is delivered.

Figure 10:
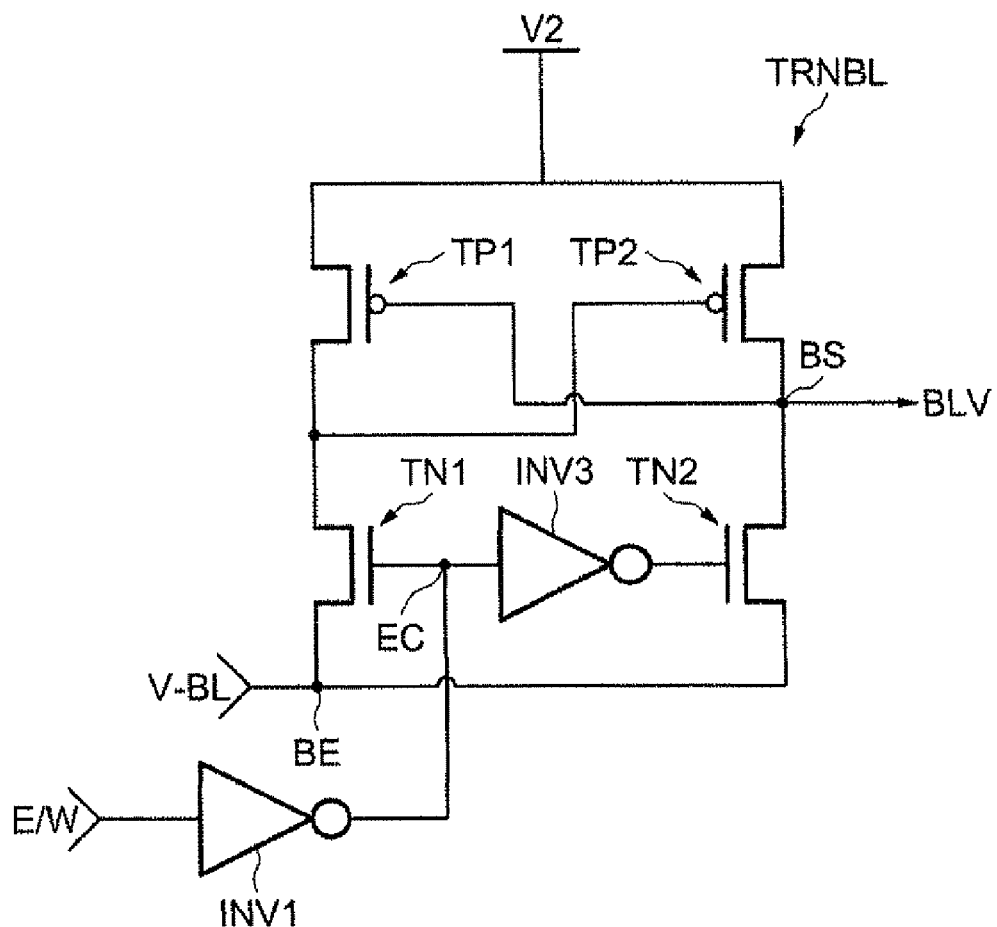
FIG. 10 is a schematic diagram of another level translator of the memory device of FIG. 3.

The structure of a level translator TRNBL is shown in FIG. 10. Here, it is structurally similar to that of the level translator TRNCG. The only difference is in the control of this level translator TRNBL, which is inverted with respect to the control of the level translator TRNCG, because of the presence of the inverter INV1.

Figure 11:
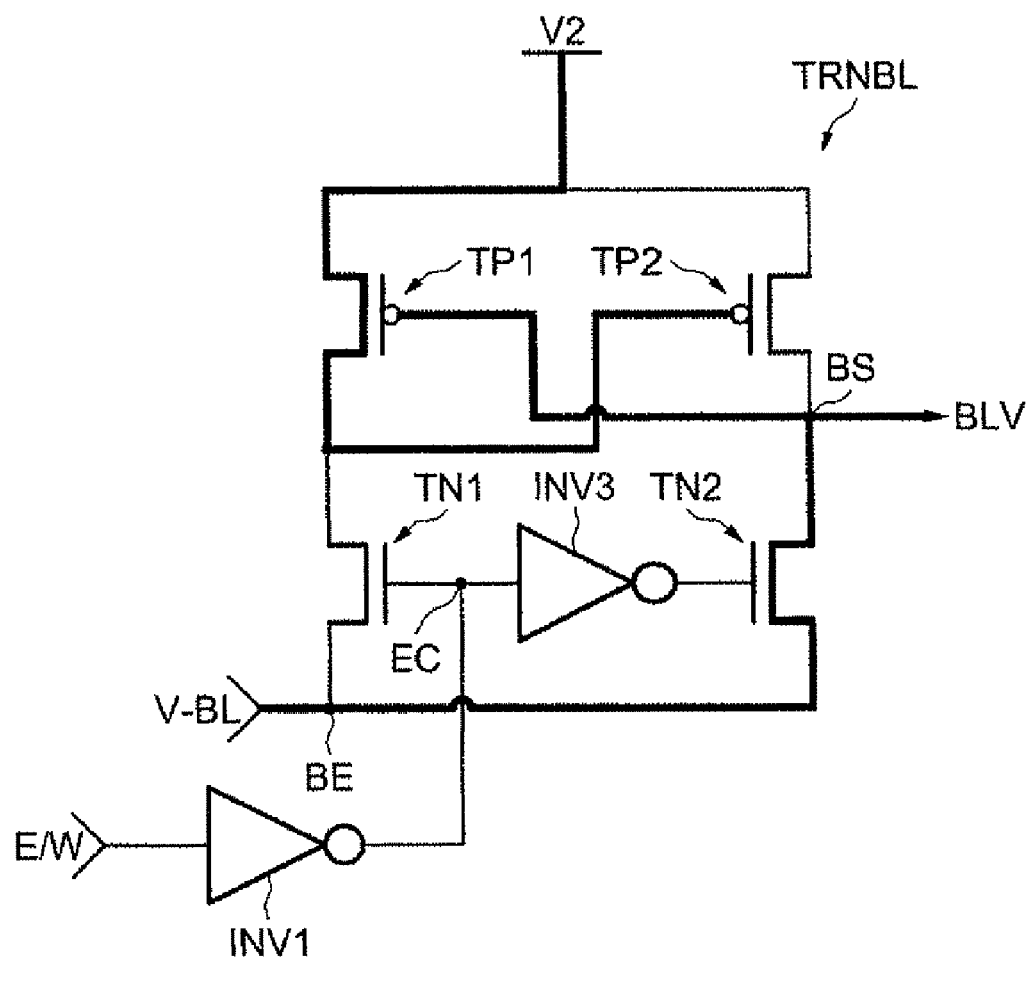
FIG. 11 is a schematic diagram of the level translator of FIG. 10 in an erasure phase.
Figure 12:
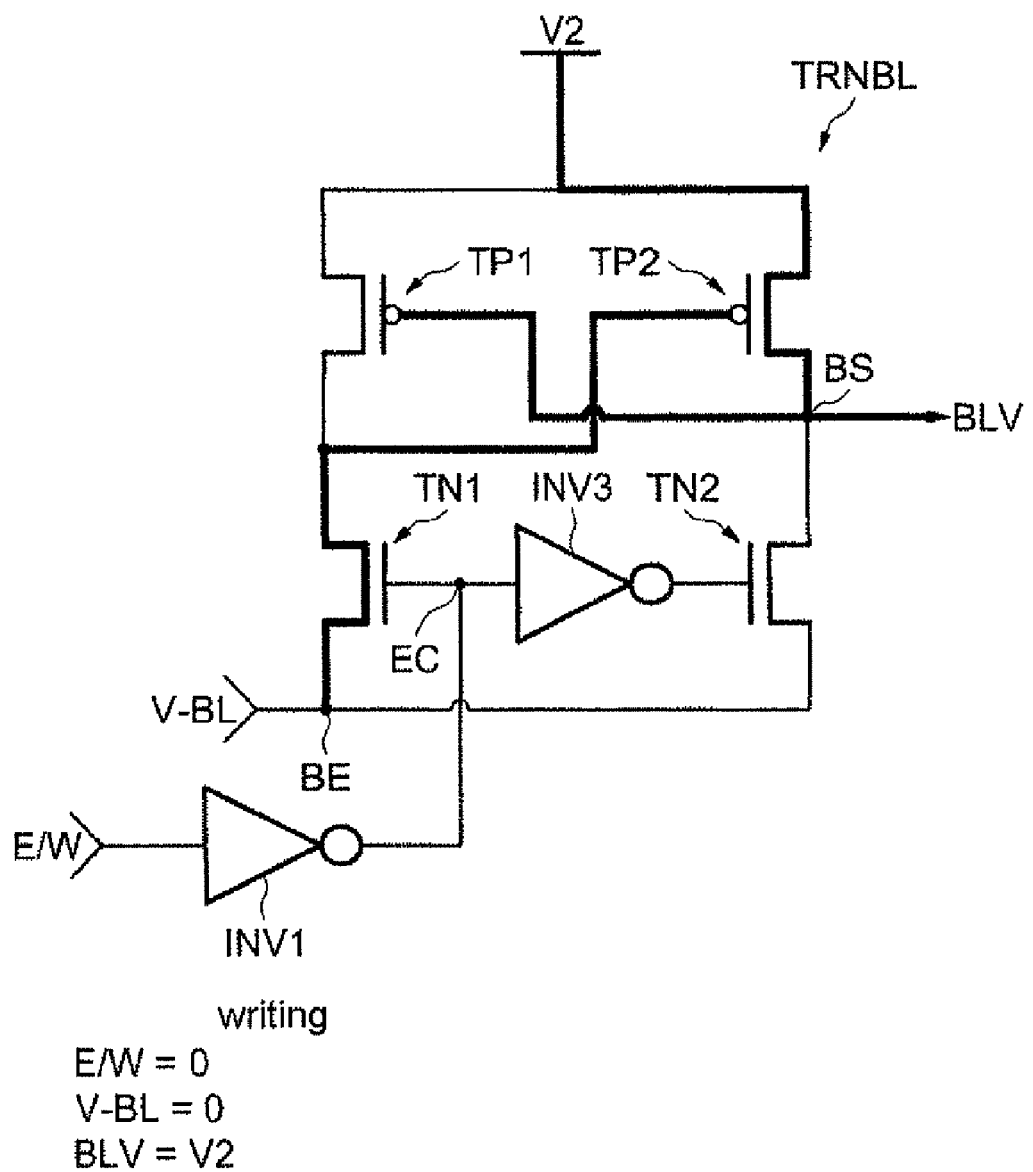
FIG. 12 is a schematic diagram of the level translator of FIG. 10 in a writing phase.

Consequently, as shown in FIG. 11, in an erase phase, the voltage BLV delivered to the output terminal BS of the level translator TRNBL is equal to the voltage V−. Conversely, in the writing phase (FIG. 12), the voltage delivered to the output terminal BS is equal to the voltage V2.

Thus the negative voltage V−, −500 millivolts for example, is sent to the bit lines during the erase phase, while this negative voltage is sent to the control gates of the floating-gate transistor of the memory points during the writing phase. The negative voltage delivered by the charge pump is also sent to the ground lines inside the memory plane during the erase phase, and thus, replaces the conventional potential of 0 volts. Thus, a short circuit may be avoided between the bit line and the ground line, by the associated memory point which is erased. It can be seen that no other change is made in the memory plane, in the latch memories, in the row and line decoders, or elsewhere.

The memory points which are actually written to, erased, or read are conventionally selected by row and column decoders. In the read mode (PROGRAM=0), the switch INT is switched to the reference voltage source Ref, and the internal ground lines BGND of the memory plane are connected to ground (0 volts), in a way which is conventional in an EEPROM because the transistor TN11 (FIG. 3) is conducting.

Figure 13:
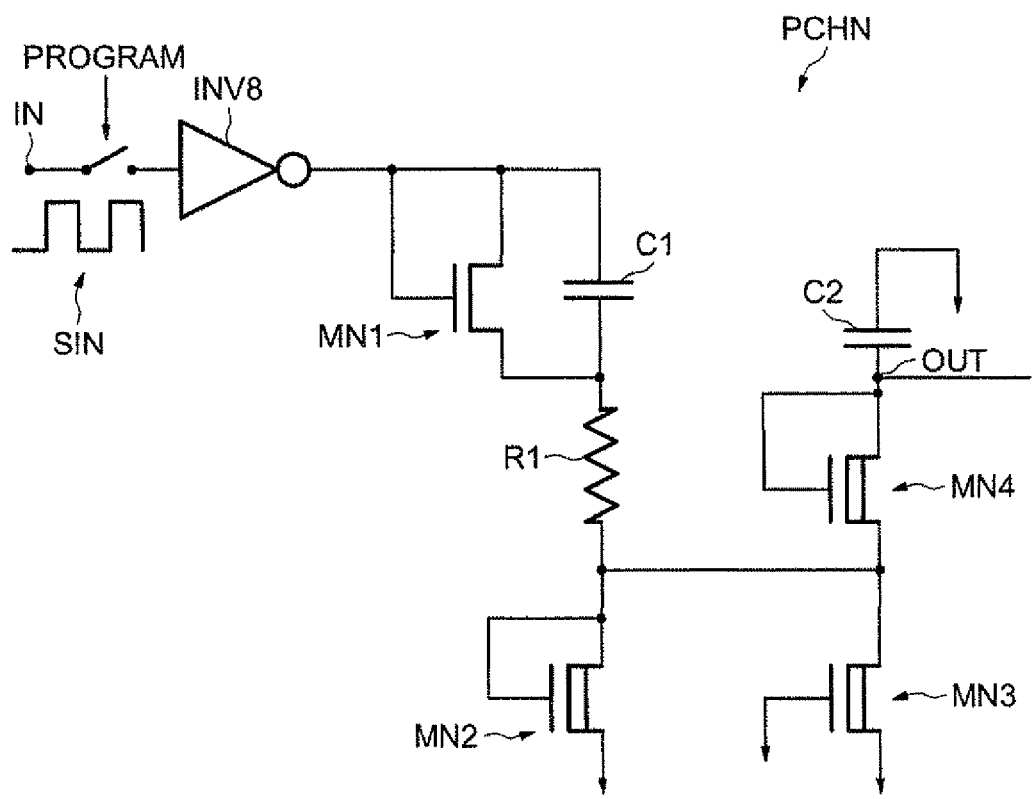
FIG. 13 is a schematic diagram of a negative charge pump circuit of the memory device of FIG. 3.

The negative charge pump circuit (FIG. 13) includes an input IN for receiving a control voltage SIN, which in this case is a square pulse voltage of 0-5 volts having a frequency in the range from several hundreds of kHz to several tens of MHz. The charge pump is activated by the value "1" of the logic signal PROGRAM. It includes a first capacitor C1 connected to the input, a first diode MN2 connected between the first capacitor and ground, a second capacitor C2 connected between the output OUT and ground, a charge transfer diode MN4 connected between the two capacitors, and a second diode MN3 connected between the transfer diode and ground.

A transistor MN1 may limit the voltage at the terminals of the first capacitor to approximately 0.9 volts, since a higher voltage at the terminals of the capacitor C1 may provide little benefit. The resistor R1 connected between the first capacitor C1 and the diode MN2 may limit the current in the transistor MN1 during the charging of the first capacitor C1, and in the diode MN3 during the discharging of the capacitor C1 into the capacitor C2.

The diode MN3 may prevent the voltage on the sources and drains of the transistors MN2, MN3 and MN4 from falling to −0.6 volts, which would result in a direct connection of the diodes to the substrate, and thus, create a risk of malfunction. The diode MN2 is formed by a native transistor (that is to say, a transistor having no implant in its channel), which has a threshold of about 100 to 300 millivolts.

Although the invention has been described for memory points having one cell per bit, it is also applicable to memory points with two cells per logical bit, which therefore have two floating-gate transistors connected to two respective bit lines, or to memory points of the type having two memory cells connected respectively to two bit lines through two bit line selection transistors. The common terminal between the bit line selection transistor and the floating-gate transistor of each memory cell of the memory point may be connected to the control gate of the floating-gate transistor of the other memory cell of the memory point, as described in French patent application No. 0 957 623 and assigned to the assignee of the present application.

That which is claimed:

1. A method of programming an electrically programmable and erasable non-volatile memory having at least one floating-gate transistor coupled to a bit line and to a voltage reference line, and configured to be programmed with a programming voltage, the method comprising:

in a phase of erasure of the electrically programmable and erasable non-volatile memory, applying a first negative voltage having an absolute value smaller than a threshold value of a PN diode to the bit line and to the voltage reference line, while applying a second positive voltage smaller than the programming voltage to a control gate of the at least one floating-gate transistor, a difference between the second positive voltage and the first negative voltage being equal to the programming voltage; and in a phase of writing to the electrically programmable and erasable non-volatile memory, applying the first negative voltage to the control gate of the at least one floating-gate transistor, and applying the second positive voltage to the bit line.

2. The method according to claim 1, wherein the at least one floating-gate transistor comprises at least one N-type conducting metal oxide semiconductor (MOS) transistor.

3. The method according to claim 1, wherein the at least one floating-gate transistor comprises at least one single-well floating-gate transistor.

4. The method according to claim 1, wherein applying the first negative voltage comprises applying a first negative voltage of −0.5 volts.

5. The method according to claim 1, wherein applying the second positive voltage comprises applying a second positive voltage of 15.5 volts.

6. A method of programming a memory having at least one floating-gate transistor coupled to a bit line and to a voltage reference line, and configured to be programmed with a programming voltage, the method comprising:
- in a phase of erasure of the electrically programmable and erasable non-volatile memory, applying a first negative voltage having an absolute value smaller than a threshold value of a PN diode to the bit line and to the voltage reference line, while applying a second positive voltage smaller than the programming voltage to a control gate of the at least one floating-gate transistor, a difference between the second positive voltage and the first negative voltage being based upon the programming voltage; and
- in a phase of writing to the electrically programmable and erasable non-volatile memory, applying the first negative voltage to the control gate of the at least one floating-gate transistor, and applying the second positive voltage to the bit line.

7. The method according to claim 6, wherein the at least one floating-gate transistor comprises at least one N-type conducting metal oxide semiconductor (MOS) transistor.

8. The method according to claim 6, wherein the at least one floating-gate transistor comprises at least one single-well floating-gate transistor.

9. The method according to claim 6, wherein applying the first negative voltage comprises applying a first negative voltage of −0.5 volts.

10. The method according to claim 6, wherein applying the second positive voltage comprises applying a second positive voltage of 15.5 volts.

11. A memory device comprising:
a memory plane comprising
- at least one electrically programmable and erasable non-volatile memory having at least one floating-gate transistor coupled to a bit line and to a voltage reference line, and
- a programming module configured to program the memory point with a programming voltage;
said programming module comprising
- a first module configured to generate a first negative voltage having an absolute value smaller than a threshold value of a PN diode,
- a second module configured to generate a second positive voltage less than the programming voltage, a difference between the second positive voltage and the first negative voltage being equal to the programming voltage, and
- a control module configured to
  - during an erasure phase of the at least one electrically programmable and erasable non-volatile memory, apply the first negative voltage to the bit line and to the voltage reference line and apply the second positive voltage to a control gate of the at least one floating-gate transistor, and
  - during a writing phase of the at least one electrically programmable and erasable non-volatile memory, apply the first negative voltage to the control gate of the at least one floating-gate transistor and apply the second positive voltage to the bit line.

12. The memory device according to claim 11, wherein said at least one floating-gate transistor comprises at least one N-type metal oxide semiconductor (NMOS) transistor.

13. The memory device according to claim 11, wherein the at least one floating-gate transistor comprises at least one single-well floating-gate transistor.

14. The memory device according to claim 11, wherein said control module is configured to apply the first negative voltage of −0.5 volt.

15. The memory device according to claim 11, wherein said control module is configured to apply the second positive voltage of 15.5 volts.

16. The memory device according to claim 11, wherein said first module comprises a negative charge pump circuit.

17. The memory device according to claim 16, wherein said negative charge pump circuit has an input for receiving a control voltage, an output for delivering the first negative voltage, said negative charge pump circuit comprising:
- a first capacitor coupled to the input;
- a first diode coupled between said first capacitor and the voltage reference line;
- a second capacitor coupled between the output and the voltage reference line;
- a charge transfer diode coupled between said first and second capacitors; and
- a second diode coupled between the transfer diode and the voltage reference line.

18. The memory device according to claim 11, wherein said first module has an output, and wherein said control module comprises a switch having an input coupled to the output of the first module, a first output, a second output, a third output, and a control circuit configured to
- receive a programming logic signal having a first logic value representing a programming operation, and a write/erase logic signal having a first logic value representing an erase operation and a second logic value representing a writing operation,
- couple the first output to the input and the third output to the voltage reference line when the first logic value of the programming logic signal and the second logic value of the write/erase logic signal are present, and
- couple the first output to the voltage reference line and the second and third outputs to the input when the first logic value of the programming logic signal and the first logic value of the write/erase logic signal are present.

19. The memory device according to claim 18, wherein said control module further comprises:
- an on/off switch coupled between the second output of said switch and the voltage reference line, said on/off switch being controllable by the write/erase logic signal;
- a first level translator controllable by the write/erase logic signal, and having an input coupled to the first output of said switch and an output coupled to said control gate; and
- a second level translator controllable by a complement of the write/erase logic signal, and having an input coupled to the third output of said switch and an output coupled to the bit line.

20. The memory device according to claim 19, wherein said memory plane comprises a matrix memory plane having a plurality of electrically programmable and erasable non-volatile memories; and wherein the programming module comprises a block of first latch memories coupled between the output of the first level translator and respective control gates of said plurality of electrically programmable and erasable non-volatile memories, and a block of second latch memories coupled between the output of the second level translator and respective bit lines coupled to said plurality of electrically programmable and erasable non-volatile memories.

21. The memory device according to claim 11, wherein said memory plane comprises at least one of an EEPROM and flash-type memory plane.

22. A memory device comprising:
- a memory having at least one floating-gate transistor coupled to a bit line and to a voltage reference line; and a programming module configured to program the at least one memory with a programming voltage, said programming module comprising
a first module configured to generate a first negative voltage having an absolute value smaller than a threshold value of a PN diode,
a second module configured to generate a second positive voltage less than the programming voltage, and
a control module configured to
during an erasure phase of the memory, apply the first negative voltage to the bit line and to the voltage reference line and apply the second positive voltage to a control gate of the at least one floating-gate transistor, a difference between the second positive voltage and the first negative voltage being based upon the programming voltage, and
during a writing phase of the memory, apply the first negative voltage to the control gate of the at least one floating-gate transistor and apply the second positive voltage to the bit line.

23. The memory device according to claim 22, wherein said memory comprises a programmable and erasable non-volatile memory.

24. The memory device according to claim 22, wherein an absolute value of the first negative voltage is 0.5 volts.

25. The memory device according to claim 22, wherein the difference between the second positive voltage and the first negative voltage is equal to the programming voltage.

26. The memory device according to claim 22, wherein said at least one floating-gate transistor comprises at least one N-type metal oxide semiconductor (NMOS) transistor.

27. The memory device according to claim 22, wherein said control module is configured to apply the first negative voltage of −0.5 volts.

28. The memory device according to claim 22, wherein said control module is configured to apply the second positive voltage of 15.5 volts.

29. The memory device according to claim 22, wherein said first module comprises a negative charge pump circuit.

30. The memory device according to claim 29, wherein said negative charge pump circuit has an input for receiving a control voltage, an output for delivering the first negative voltage, said negative charge pump circuit comprising:
a first capacitor coupled to the input;
a first diode coupled between said first capacitor and the voltage reference line;
a second capacitor coupled between the output and the voltage reference line;
a charge transfer diode coupled between said first and second capacitors; and
a second diode coupled between the transfer diode and the voltage reference line.

31. The memory device according to claim 22 wherein said first module has an output, and wherein said control module comprises a switch having an input coupled to the output of the first module, a first output, a second output, a third output, and a control circuit configured to
receive a programming logic signal having a first logic value representing a programming operation, and a write/erase logic signal having a first logic value representing an erase operation and a second logic value representing a writing operation,
couple the first output to the input and the third output to the voltage reference line when the first logic value of the programming logic signal and the second logic value of the write/erase logic signal are present, and
couple the first output to the voltage reference line and the second and third outputs to the input when the first logic value of the programming logic signal and the first logic value of the write/erase logic signal are present.

32. The memory device according to claim 31, wherein said control module further comprises:
an on/off switch coupled between the second output of said switch and the voltage reference line, said on/off switch being controllable by the write/erase logic signal;
a first level translator controllable by the write/erase logic signal, and having an input coupled to the first output of said switch and an output coupled to said control gate; and
a second level translator controllable by a complement of the write/erase logic signal, and having an input coupled to the third output of said switch and an output coupled to the bit line.

\* \* \* \* \*